United States Patent
Kobayashi et al.

(10) Patent No.: US 10,964,539 B2
(45) Date of Patent: Mar. 30, 2021

(54) IMPRINTING METHOD AND SEMICONDUCTOR DEVICE MANUFACTURING METHOD

(71) Applicant: TOSHIBA MEMORY CORPORATION, Tokyo (JP)

(72) Inventors: Kei Kobayashi, Yokohama Kanagawa (JP); Hirokazu Kato, Kariya Aichi (JP); Takayuki Nakamura, Machida Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/557,787

(22) Filed: Aug. 30, 2019

(65) Prior Publication Data

US 2020/0303190 A1    Sep. 24, 2020

(30) Foreign Application Priority Data

Mar. 19, 2019  (JP) .............................. JP2019-050706

(51) Int. Cl.
*H01L 21/033* (2006.01)
*G03F 7/00* (2006.01)
*H01L 21/027* (2006.01)
*H01L 21/311* (2006.01)

(52) U.S. Cl.
CPC ........ *H01L 21/0337* (2013.01); *G03F 7/0002* (2013.01); *H01L 21/0271* (2013.01); *H01L 21/31144* (2013.01)

(58) Field of Classification Search
CPC .......... H01L 21/0337; H01L 21/31144; H01L 21/0271; G03F 7/0002
USPC .......................................................... 438/702
See application file for complete search history.

(56) References Cited

U.S. PATENT DOCUMENTS

| | | | |
|---|---|---|---|
| 7,939,131 B2* | 5/2011 | Xu .......................... | B82Y 10/00 427/240 |
| 2010/0164146 A1 | 7/2010 | Furutono et al. | |
| 2013/0224503 A1* | 8/2013 | Suzuki ................. | C09D 183/06 428/447 |
| 2016/0160003 A1* | 6/2016 | Kitagawa ................ | B29C 43/02 428/195.1 |

FOREIGN PATENT DOCUMENTS

| | | |
|---|---|---|
| JP | 2013069921 A | 4/2013 |
| JP | 2016149525 A | 8/2016 |
| WO | 2007116469 A1 | 10/2007 |

* cited by examiner

*Primary Examiner* — Vu A Vu
(74) *Attorney, Agent, or Firm* — Kim & Stewart LLP

(57) ABSTRACT

According to one embodiment, an imprinting method comprises forming a carbon film on a substrate. The carbon film being oxygen in an amount of less than or equal to 15% by weight. A transfer material is dispensed over the carbon film. A patterned template is brought into contact with the transfer material. The transfer material is cured with light passing through the patterned template. The patterned template is then detached from the cured transfer material.

19 Claims, 4 Drawing Sheets

IMPRINTING METHOD AND SEMICONDUCTOR DEVICE MANUFACTURING METHOD

CROSS-REFERENCE TO RELATED APPLICATION

This application is based upon and claims the benefit of priority from Japanese Patent Application No. 2019-050706, filed Mar. 19, 2019, the entire contents of which are incorporated herein by reference.

FIELD

Embodiments described herein relate generally to an imprinting method and a semiconductor device manufacturing method.

BACKGROUND

An imprinting method has been proposed as a method for forming fine patterns. The imprinting method involves steps of applying a transfer material, such as a resist, onto a film that has been formed on a substrate, pressing a template having a fine pattern formed thereon against the transfer material so the space between the template and the substrate is filled with the transfer material, and then subsequently irradiating the transfer material with ultraviolet light to cure the transfer material. After detaching the template from the transfer material, the transfer material patterned on the substrate serves as a mask for processing of the film on the substrate.

DETAILED DESCRIPTION

In general, according to one embodiment, an imprinting method includes: forming a carbon film on a substrate, the carbon film comprising oxygen in an amount of less than or equal to 15% by weight; dispensing a transfer material over the carbon film; bringing a patterned template into contact with the transfer material; curing the transfer material with light through the patterned template; and detaching the patterned template from the cured transfer material.

Example embodiments of the present disclosure will now be described with reference to the drawings. These embodiments are not to be construed as limiting the present disclosure. Furthermore, it should be understood that equivalents or modifications of the described example components or elements that would be obvious to those of ordinary skill in the art, are within the scope of the present disclosure.

Embodiments (Construction of Imprinting Apparatus)

Figure 1:
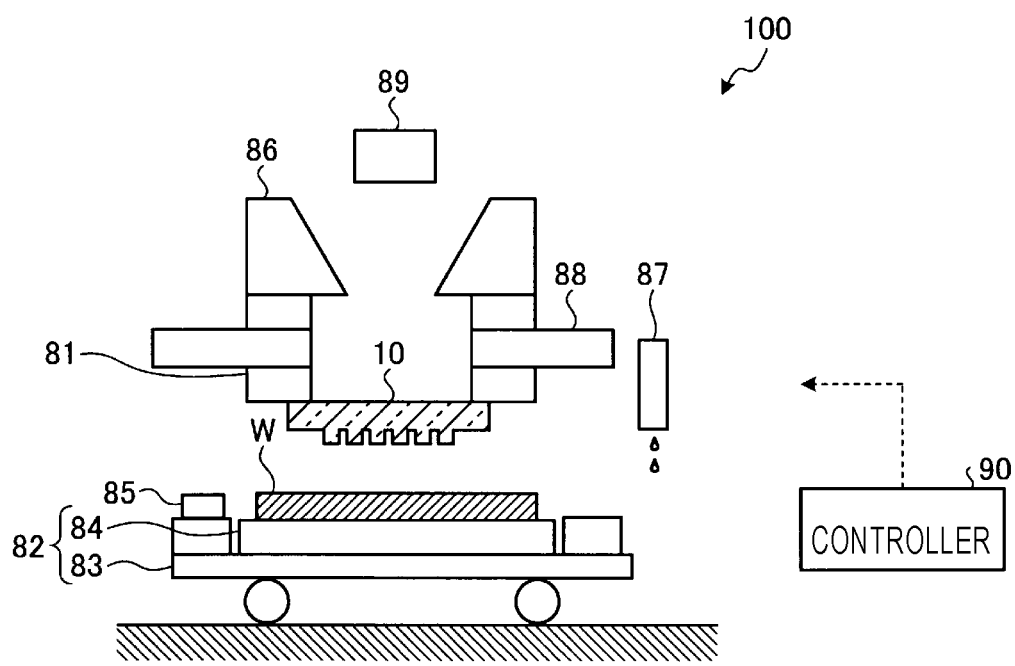
FIG. 1 is a diagram of an imprinting apparatus according to an embodiment.

FIG. 1 is a diagram of an imprinting apparatus 100 according to an embodiment.

As depicted in FIG. 1, the imprinting apparatus 100 includes a template stage 81, a wafer stage 82, a reference mark 85, an alignment sensor 86, a liquid dispensing device 87, a stage base 88, a light source 89, and a controller 90. A template 10 has been installed on the imprinting apparatus 100.

The wafer stage 82 includes a wafer chuck 84 and a body 83. The wafer chuck 84 holds a wafer W at a predetermined position on the body 83. The wafer W is, for example, a semiconductor substrate which is to be patterned or otherwise processed in accordance with a pattern transferred to the wafer W from template 10 by imprinting. The reference mark 85 is provided on the wafer stage 82. The reference mark 85 is used for positioning of the wafer W when loading it onto the wafer stage 82.

The wafer stage 82 moves in a plane substantially parallel to the main surface of the wafer W, this plane may be referred to as a horizontal plane in this context. The wafer stage 82 moves the wafer W to a position below the liquid dispensing device 87 so that a resist, also referred to as a transfer material, can be dispensed as droplets or the like onto the wafer W. The wafer stage 82 moves the wafer W to a position below the template 10 for performing pattern transfer processing (imprinting of template 10) on the wafer W.

The stage base 88 supports the template 10 via the template stage 81, and moves vertically (e.g., up-down direction of FIG. 1) to press the fine pattern 13 on the template 10 to the resist dispensed onto the wafer W. The alignment sensor 86 is provided on the stage base 88. The alignment sensor 86 is a sensor for detecting the positions of the wafer W and the template 10.

The liquid dispensing device 87 is a device for dispensing the resist onto the wafer W by an ink-jet method. An ink-jet head, provided in the liquid dispensing device 87, has a plurality of nozzles for ejecting droplets of the resist, and dispenses these droplets onto the wafer W.

The resist is a resin material which may be, for example, a photo-curable resin that hardens with light, or a thermosetting resin that hardens with heating. A photo-curable resin is used in this particular example embodiment.

The light source 89 emits, for example, ultraviolet light, and is provided above the stage base 88. The light source 89 irradiates the resist with light from through the template 10 while the template is pressing on the resist.

The controller 90 controls the template stage 81, the wafer stage 82, the reference mark 85, the alignment sensor 86, the liquid dispensing device 87, the stage base 88, and the light source 89.

(Example of Imprinting Process)

FIGS. 2A through 2E are process flow diagrams illustrating steps of an imprinting process performed by the imprinting apparatus 100 of this embodiment. Here, the imprinting process constitutes part of a semiconductor device manufacturing process.

First, a film OX, such as a silicon oxide film, is formed on the wafer W. An SOC (spin-on-carbon) film CL, which is an example of a coating-type carbon film, is formed on the film OX. The SOC film CL is a coated film formed, for example, by spin coating and is an organic film composed mainly of carbon.

The wafer W, on which the film OX and the SOC film CL have been formed, is placed on the wafer stage 82, and the wafer stage 82 is then moved to a position below the liquid dispensing device 87.

Figure 2A:
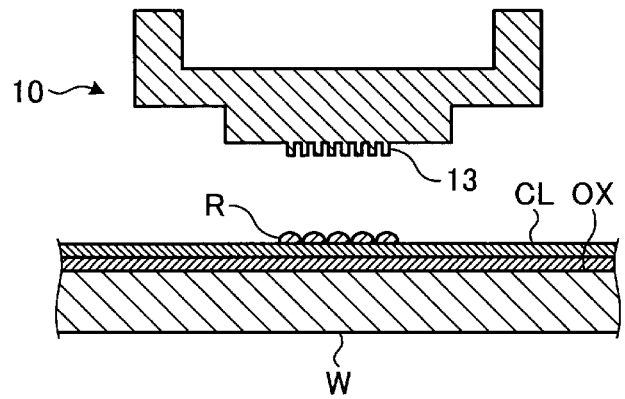
FIGS. 2A through 2E illustrate steps of an imprinting process according to an embodiment.

As shown in FIG. 2A, droplets of a resist R are dispensed from the liquid dispensing device 87 onto the upper surface of the SOC film CL. Subsequently, the wafer stage 82 is moved to a position below the template 10.

Figure 2B:
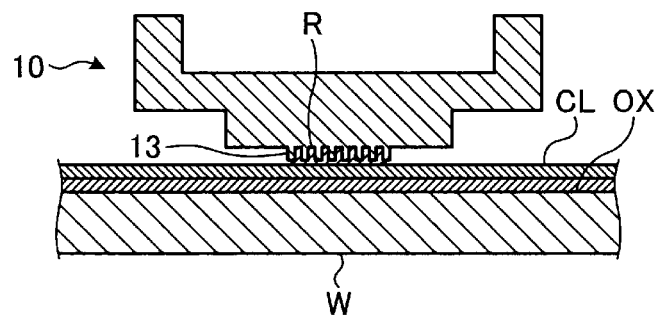

As shown in FIG. 2B, the template stage 81 is moved downward to press the fine pattern 13 of the template 10 against the resist R while performing positioning/alignment by means of the alignment sensor 86.

After the pressing has continued for a predetermined time, the droplets of dispensed resist R spread in the space between the template 10 and the wafer W, and the recessed portions of the fine pattern 13 become filled with the resist R.

Next, while still pressing the template 10 against the resist R, the resist R is irradiated with light from the light source 89, thereby curing the resist R.

Figure 2C:
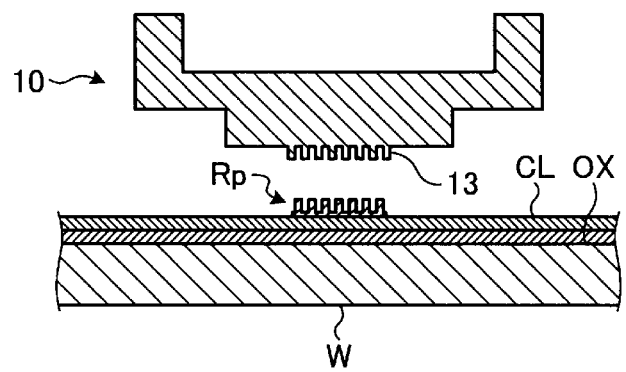

As shown in FIG. 2C, the template 10 is then detached from the wafer W, whereby a resist pattern $R_p$, which corresponds to the fine pattern 13, is formed on the SOC film CL.

Figure 2D:
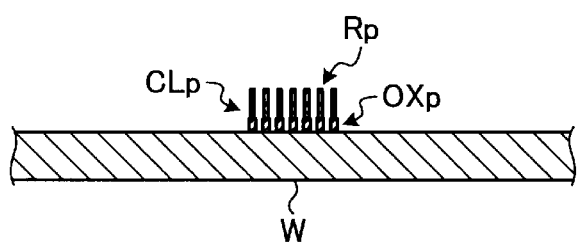

As shown in FIG. 2D, the SOC film CL and the film OX are processed using the resist pattern $R_p$ as a mask, thereby forming an SOC film pattern $CL_p$ and a film pattern $OX_p$.

Figure 2E:
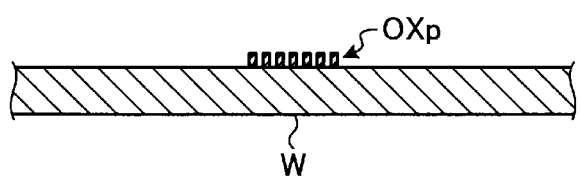

As shown in FIG. 2E, the resist pattern $R_p$ and SOC film pattern $CL_p$ are removed, e.g. by asking, to obtain the film pattern $OX_p$ alone on the wafer W. The same process as the above-described process can be repeated to form a plurality of film patterns on the wafer W. A semiconductor device can thus be manufactured.

(Details of Resist-Filling Step)

The resist R filling step in the imprinting process will now be further described with reference to FIGS. 3A through 3D. FIGS. 3A through 3D are diagrams illustrating how a space between the template 10 and the SOC film CL becomes filled with the resist R in the imprinting process of this embodiment.

Figure 3A:
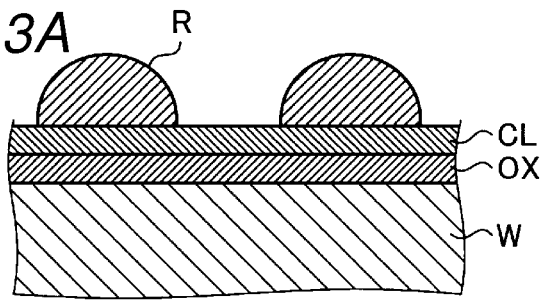
FIGS. 3A through 3D depict aspects of how a space between template and substrate becomes filled with resist.
Figure 3A:
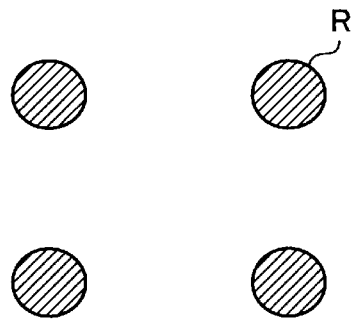

As shown in FIG. 3A, droplets of the resist R are initially formed on the SOC film CL.

Figure 3B:
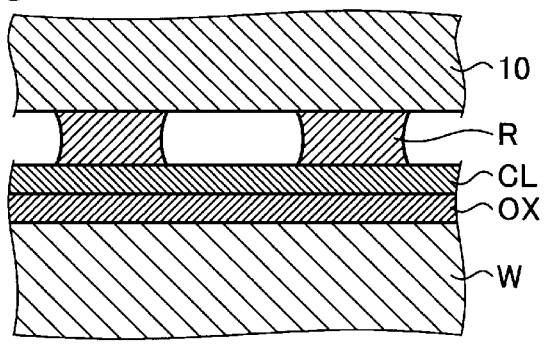
Figure 3B:
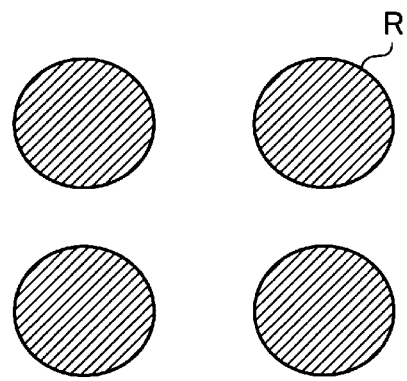

As shown in FIG. 3B, the template 10 is pressed against these droplets of the resist R.

Figure 3C:
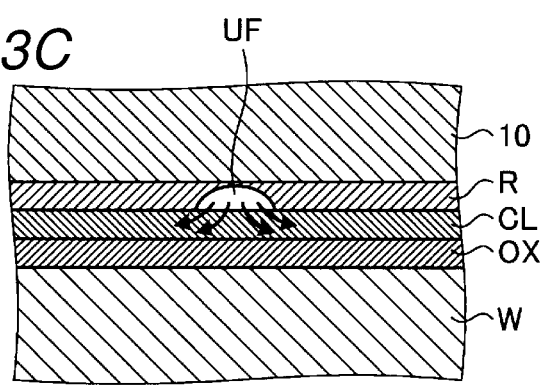
Figure 3C:
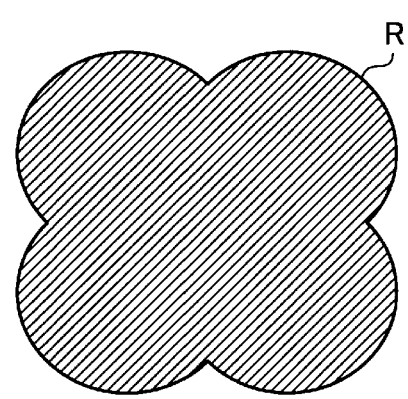

As shown in FIG. 3C, in the pressing the droplets of the resist R are deformed and begin to agglomerate/coalesce. There may still exist unfilled spaces UF which are surrounded by but not yet filled with the resist R.

Figure 3D:
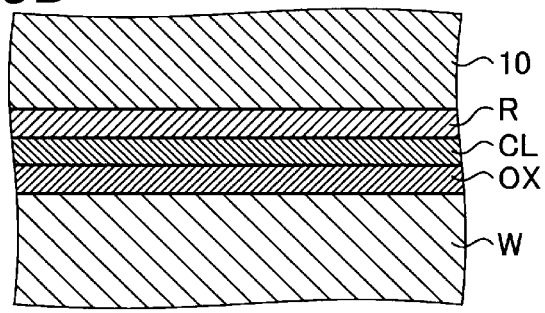
Figure 3D:
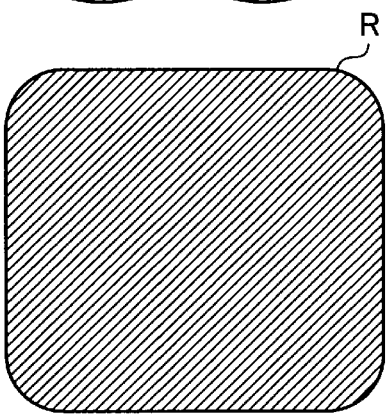

As shown in FIG. 3D, the unfilled spaces UF eventually become filled with the resist R, upon which filling of the resist R into the space between the template 10 and the wafer W is completed.

The unfilled spaces UF of FIG. 3C are considered to be substantially filled with gas corresponding to the ambient atmosphere from within the imprinting apparatus 100. In some examples, the imprinting apparatus 100 is filled with helium (He) gas or the like. In such examples, the unfilled spaces UF are thus filled with helium gas or the like. In general, the unfilled spaces UF will not be filled with the resist R unless the gas within the unfilled spaces UF is discharged. However, the unfilled spaces UF are surrounded by the resist R.

If the SOC film CL is a film containing oxygen in an amount of not more than 15% by weight, preferably not more than 10% by weight, then the trapped atmosphere in the unfilled spaces UF may diffuse into the SOC film CL. The oxygen content in the SOC film CL may be measured, for example, with an elemental analyzer or the like for measuring oxygen content of organic or other materials/samples. In general, the oxygen content of a SOC film CL will be greater than zero.

The unfilled spaces UF become filled with the resist R and disappear as the trapped atmosphere in the unfilled spaces UF diffuses into the SOC film CL.

The oxygen content in the SOC film CL may be adjusted to a certain extent by varying conditions for the formation of the SOC film CL, such as the temperature and atmosphere during baking steps performed in the formation of the SOC film CL. For example, the baking steps can be performed in a low-oxygen atmosphere or a nitrogen atmosphere. Thereby, oxidation of the SOC film CL is suppressed, and the hydrophobic properties improves.

Comparative Example

In a comparative imprinting process, a resist is dropped directly onto a to-be-processed film formed on a wafer. However, this method requires a long time for the atmosphere in unfilled spaces to escape/diffuse out of the resist. Thus, it takes a long time to complete the resist-filling step, leading to a low throughput of the imprinting process.

The present inventors have studied methods for quickly discharging the atmosphere trapped in unfilled spaces of a resist, and have developed the idea of interposing a film having excellent gas diffusing properties between the resist and a to-be-processed film. The present inventors have found through intensive experimentation that an SOC film having hydrophobic properties or, that is, an SOC film having low polarity has excellent gas diffusing properties in this context. One possible method for making an SOC film hydrophobic is to make the oxygen content in the SOC film as low as possible.

In the imprinting process of this embodiment, the SOC film CL containing oxygen in an amount of not more than 15% by weight, preferably not more than 10% by weight, is interposed between the resist R and the to-be-processed film OX. This allows the atmosphere in the unfilled spaces UF trapped in the resist R to diffuse into the SOC film CL, thus making it possible to more quickly fill the unfilled spaces UF with the resist R. The time taken to complete the filling of the resist R can be reduced and the throughput of the imprinting process can be increased.

(Variation 1)

An imprinting process according to variation 1 of this embodiment will now be described. The imprinting process according to variation 1 differs from the above-described embodiment in that the SOC film CL is subjected to a hydrophilic treatment.

As described above, the SOC film CL can be made hydrophobic and the filling of the resist R can be speeded up by making the oxygen content in the SOC film CL as low as possible. However, the resist R is likely to peel off such a hydrophobic film when the template 10 is removed after imprinting.

The present inventors have found that by making the outermost surface of the SOC film CL hydrophilic, peeling of the resist R can be prevented while still maintaining the gas diffusing properties of the SOC film CL.

At least one of an oxygen plasma treatment, an ozone water treatment, and a UV irradiation treatment in a vacuum atmosphere may be performed as a hydrophilic treatment of the outermost surface of the SOC film CL.

The peelability of the resist R is pattern dependent, that is may vary if the imprinted pattern is a hole pattern or a line-and-space pattern. Peelability also varies depending on the resist coverage.

A hydrophilic treatment of the SOC film CL is effective, for example, when the resist coverage is around 50%. The resist coverage herein refers to the proportion per unit area of an area covered with the cured resist R within a relevant surface region of the wafer W. It is considered possible that when the resist coverage is around 50%, the force upon detachment of the template 10 will be large, and therefore the resist R is more likely to peel off.

In the SOC film CL containing oxygen in an amount of not more than 15% by weight, preferably not more than 10% by weight, the pure-water contact angle of the surface of the SOC film CL can be, for example, greater than or equal to 60 degrees, and preferably not less than 70 degrees. The pure-water contact angle can be determined, for example, by dispensing a droplet of pure water onto the surface of the SOC film CL, and measuring the angle between the surface of the SOC film CL and the droplet.

The hydrophilic treatment is effective also in the case of using the SOC film CL having a pure-water contact angle of greater than or equal to 60 degrees. By subjecting such an SOC film CL to the above-described hydrophilic treatment, the hydrophobicity of the SOC film CL decreases only in the outermost surface, and the pure-water contact angle becomes lower than the above value.

SOC films CL having the same oxygen content do not always have the same pure-water contact angle. Due to a compositional variation between SOC films CL, for example, the surfaces of some SOC films CL can be oxidized on baking during the formation of the SOC films CL. The oxidation may produce a similar effect as the hydrophilic treatment discussed above. Thus, SOC films CL meeting the bulk compositional requirement may have a pure-water contact angle less than the above values, and therefore may not need an additional hydrophilic treatment.

By making the outermost surface of the SOC film CL hydrophilic in this Variation 1, peeling of the resist R can be prevented without impairing the gas diffusing properties of the SOC film CL.

(Variation 2)

A semiconductor device manufacturing process according to Variation 2 of an embodiment will now be described with reference to FIGS. 4A through 4D. The semiconductor device manufacturing process according to Variation 2 differs from the above-described embodiment in that the SOC film CL is also used as a mask.

Figure 4A:
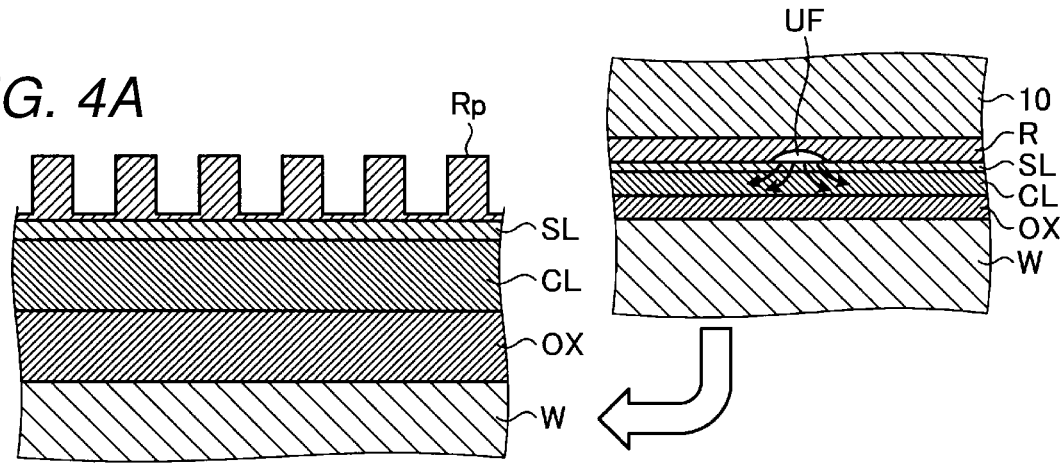
FIGS. 4A through 4D illustrate steps of a semiconductor device manufacturing process according to a variation of an embodiment.

FIGS. 4A through 4D are process flow diagrams illustrating steps of the semiconductor device manufacturing process according to Variation 2. As shown in FIG. 4A, a SOG (silicon-on-glass) film SL, which is a coat able silicon oxide film, is formed on an SOC film CL over a film OX.

As described above, the SOC film CL is a film containing oxygen in an amount of not more than 15% by weight, preferably not more than 10% by weight. The SOG film SL is a coated film formed, for example, by spin coating, and is an inorganic film composed mainly of silicon.

The thickness of the SOC film CL in Variation 2 is made larger than that of the above-described example embodiment because in Variation 2 the SOC film CL is additionally used as a mask for processing the underlying film OX.

A resist pattern $R_p$ is formed on the SOG film SL by substantially the same imprinting process as in the above-described embodiments. As illustrated in the right-hand portion of FIG. 4A, the gas diffusing properties of the SOC film CL are not significantly impaired by the presence of the SOG film SL interposed between the resist R and the SOC film CL. Thus, the resist R can still be filled quickly in the imprinting process.

Figure 4B:
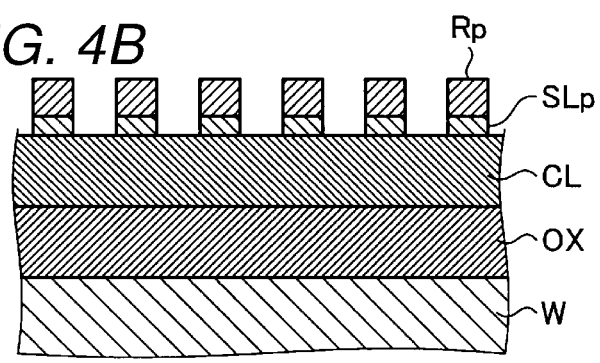

As shown in FIG. 4B, the SOG film SL is processed using the resist pattern $R_p$ as a mask, thereby forming an SOG film pattern $SL_p$.

Figure 4C:
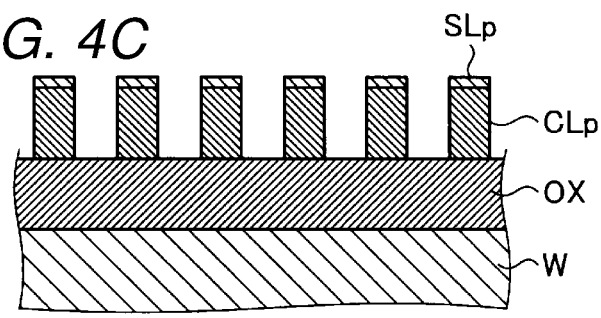

As shown in FIG. 4C, the SOC film CL is processed using the SOG film pattern $SL_p$ as a mask, thereby forming an SOC film pattern $CL_p$.

Figure 4D:
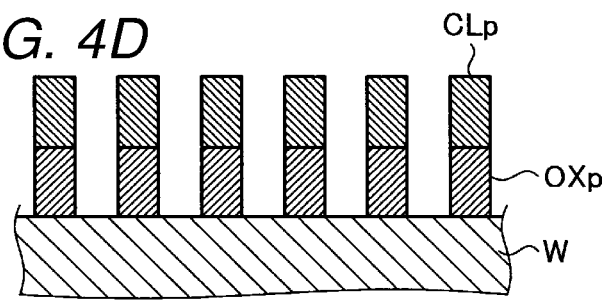

As shown in FIG. 4D, the film OX is processed using the SOC film pattern $CL_p$ as a mask, thereby forming a film pattern $OX_p$.

According to the semiconductor device manufacturing process of Variation 2, the SOG film SL can be interposed between the resist R and the SOC film CL without significantly impairing the gas diffusing properties of the SOC film CL. This makes it possible to process the film OX using the SOC film pattern $CL_p$ as a mask having a higher etch selectivity than the film OX relative to the resist pattern $R_p$. Therefore, the processing accuracy of the film OX can be enhanced.

In the above-described examples, droplets of the resist R are dispensed onto the wafer W. However, resist may be applied onto the wafer by other methods, such as spin coating. Even with these other methods, bubbles or the like may be trapped in the resist, and an advantageous effect regarding filling of unfilled spaces as in above-described examples can still be obtained.

Particular Compositional Examples

A description will now be given of SOC films A to E applied in an imprinting process.

Wafers having the SOC films A to E were prepared. For each of the SOC films A to E, the oxygen content, the pure-water contact angle and the resist-filling time in the imprinting process were measured. The results are shown in Table 1 below.

TABLE 1

| SOC | A | B | C | D | E |
|---|---|---|---|---|---|
| O Content (atom %) | 3 | 6 | 6 | 10 | 18 |
| Pure-Water Contact Angle (degree) | 80 | 62 | 67 | 56 | 42 |
| Filling Time (sec) | 1 | 1.3 | 1.4 | 1.5 | 2.3 |
| O Content (wt %) | 6 | 11 | 13 | 18 | 30 |

As can be seen in Table 1, there is a correlation between the oxygen content, the pure-water contact angle, and the resist-filling time in the imprinting process.

In particular, the pure-water contact angle of the surface of an SOC film tends to increase with decrease in the oxygen content in the SOC film. This indicates that the hydrophobicity of an SOC film increases and the polarity of the SOC film decreases with decrease in the oxygen content.

Further, the time required for filling of the resist in the imprinting process tends to decrease with decrease in the oxygen content in the SOC film, or with increase in the pure-water contact angle of the surface of the SOC film. This indicates that the gas diffusing properties of the SOC film increase with hydrophobicity of the SOC film and decreases in the polarity of the SOC film.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An imprinting method, comprising:
   forming a carbon film on a substrate, the carbon film comprising oxygen in an amount of less than or equal to 15% by weight;
   dispensing a transfer material over the carbon film;
   bringing a patterned template into contact with the transfer material;
   curing the transfer material with light through the patterned template; and
   detaching the patterned template from the cured transfer material, wherein a pure-water contact angle of the carbon film after formation is greater than or equal to 60 degrees.

2. The imprinting method according to claim 1, wherein the carbon film is not treated prior to the dispensing of the transfer material.

3. The imprinting method according to claim 1, wherein forming the carbon film includes making a surface of the carbon film hydrophilic.

4. The imprinting method according to claim 3, wherein at least one of an oxygen plasma treatment, an ozone water treatment, or an ultraviolet treatment in a vacuum atmosphere is performed to make the surface of the carbon film hydrophilic.

5. The imprinting method according to claim 1, further comprising:
   forming a silicon oxide film on the carbon film.

6. The imprinting method according to claim 1, wherein forming the carbon film comprises spin coating an organic film on the substrate.

7. The imprinting method according to claim 1, wherein the carbon film comprises 10% or less oxygen by weight.

8. The imprinting method according to claim 1, further comprising:
   forming a spin-on-glass layer over the carbon film prior to dispensing the transfer material.

9. The imprinting method of claim 1, wherein the transfer material is dispensed as droplets over the carbon film.

10. The imprinting method of claim 1, further comprising:
    etching the substrate using the cured transfer material as a mask.

11. A method of manufacturing a semiconductor device, the method comprising:
    forming a first film on a semiconductor substrate;
    forming a carbon film on the first film, the carbon film comprising oxygen in an amount of less than or equal to 15% by weight;
    dispensing a transfer material over the carbon film;
    bringing a patterned template into contact with the transfer material;
    curing transfer material with light through the patterned template;
    detaching the patterned template from the cured transfer material; and
    processing first film using the cured transfer material as a mask, wherein
    the carbon film has a pure-water contact angle after formation of greater than or equal to 60 degrees.

12. The method according to claim 11, wherein forming the carbon film includes making a surface of the carbon film hydrophilic.

13. The method according to claim 11, further comprising performing at least one of an oxygen plasma treatment, an ozone water treatment, or an ultraviolet treatment in a vacuum atmosphere on the carbon film before dispensing the transfer material.

14. The method according to claim 11, further comprising:
    forming a silicon oxide film on the carbon film.

15. The method according to claim 11, wherein forming the carbon film comprises spin coating an organic film on the first film.

16. The method according to claim 11, wherein the carbon film comprises 10% or less oxygen by weight.

17. The method according to claim 11, further comprising:
    forming a spin-on-glass layer over the carbon film prior to dispensing the transfer material.

18. The method of claim 11, wherein the transfer material is dispensed as droplets over the carbon film.

19. The method of claim 11, wherein processing the first film comprises etching the first film.

* * * * *